United States Patent
Hung et al.

(10) Patent No.: US 9,977,627 B1
(45) Date of Patent: May 22, 2018

(54) MEMORY DEVICE AND MEMORY CONTROLLING METHOD

(71) Applicant: MACRONIX INTERNATIONAL CO., LTD., Hsinchu (TW)

(72) Inventors: Chun-Hsiung Hung, Hsinchu (TW); Han-Sung Chen, Hsinchu (TW); Chung-Kuang Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days. days.

(21) Appl. No.: 15/346,790

(22) Filed: Nov. 9, 2016

(51) Int. Cl.
G11C 7/00 (2006.01)
G06F 3/06 (2006.01)
G11C 16/34 (2006.01)
G11C 16/04 (2006.01)

(52) U.S. Cl.
CPC .......... *G06F 3/0659* (2013.01); *G06F 3/0604* (2013.01); *G06F 3/0619* (2013.01); *G06F 3/0652* (2013.01); *G06F 3/0679* (2013.01); *G11C 16/0483* (2013.01); *G11C 16/3431* (2013.01); *G11C 16/3495* (2013.01)

(58) Field of Classification Search
CPC ..... G11C 11/5642; G11C 16/24; G11C 16/26; G11C 16/3418
See application file for complete search history.

(56) References Cited

U.S. PATENT DOCUMENTS

| | | | | |
|---|---|---|---|---|
| 6,091,623 A | * | 7/2000 | Kang | ...... G11C 11/22 365/145 |
| 2005/0073869 A1 | * | 4/2005 | Gudesen | ...... G11C 11/22 365/145 |
| 2009/0310408 A1 | * | 12/2009 | Lee | ...... G11C 11/5628 365/185.03 |
| 2010/0232221 A1 | * | 9/2010 | Park | ...... G11C 11/5642 365/185.03 |
| 2014/0226412 A1 | | 8/2014 | Yeh et al. | |
| 2015/0262699 A1 | * | 9/2015 | Shirakawa | ...... G11C 16/3445 365/185.11 |
| 2017/0083436 A1 | * | 3/2017 | Jung | ...... G06F 12/0246 |

* cited by examiner

*Primary Examiner* — Tuan T Nguyen
(74) *Attorney, Agent, or Firm* — Finnegan, Henderson, Farabow, Garrett & Dunner LLP

(57) ABSTRACT

A memory device includes a memory unit including a plurality of memory cells, and a controller including a storage unit that stores a plurality of operation selections each corresponding to a property of at least one selected memory cell among the plurality of memory cells.

20 Claims, 7 Drawing Sheets

US 9,977,627 B1

MEMORY DEVICE AND MEMORY CONTROLLING METHOD

FIELD OF THE DISCLOSURE

The present disclosure relates to a memory device including a memory unit and a method of controlling the memory unit by a controller in the memory device.

BACKGROUND

A memory device includes a plurality of memory cells for storing data. The data stored in a memory cell is determined by a threshold voltage of the memory cell. However, the threshold voltage of a memory cell may drift due to various reasons, such as program disturb, read disturb, temperature variation, and data retention. Such drifting may result in false reading of the data stored in the memory cells, rendering the memory device unreliable.

SUMMARY

According to an embodiment of the disclosure, a memory device includes a memory unit including a plurality of memory cells, and a controller including a storage unit that stores a plurality of operation selections. Each one of the plurality of operation selections corresponds to a property of at least one selected memory cell among the plurality of memory cells.

According to another embodiment of the disclosure, a memory unit includes a plurality of memory cells, and a storage device configured to store a plurality of operation parameters to be used for a program operation, read operation, or erase operation of the memory cells. The operation parameters are changed according to a property of at least one selected memory cell among the plurality of memory cells.

According to still another embodiment of the disclosure, a method for controlling a memory unit by a controller includes storing a plurality of operation selections in a storage unit, monitoring a property of a selected memory cell among a plurality of memory cells in the memory unit, and selecting one of the plurality of operation selections based on the property of the selected memory cell.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
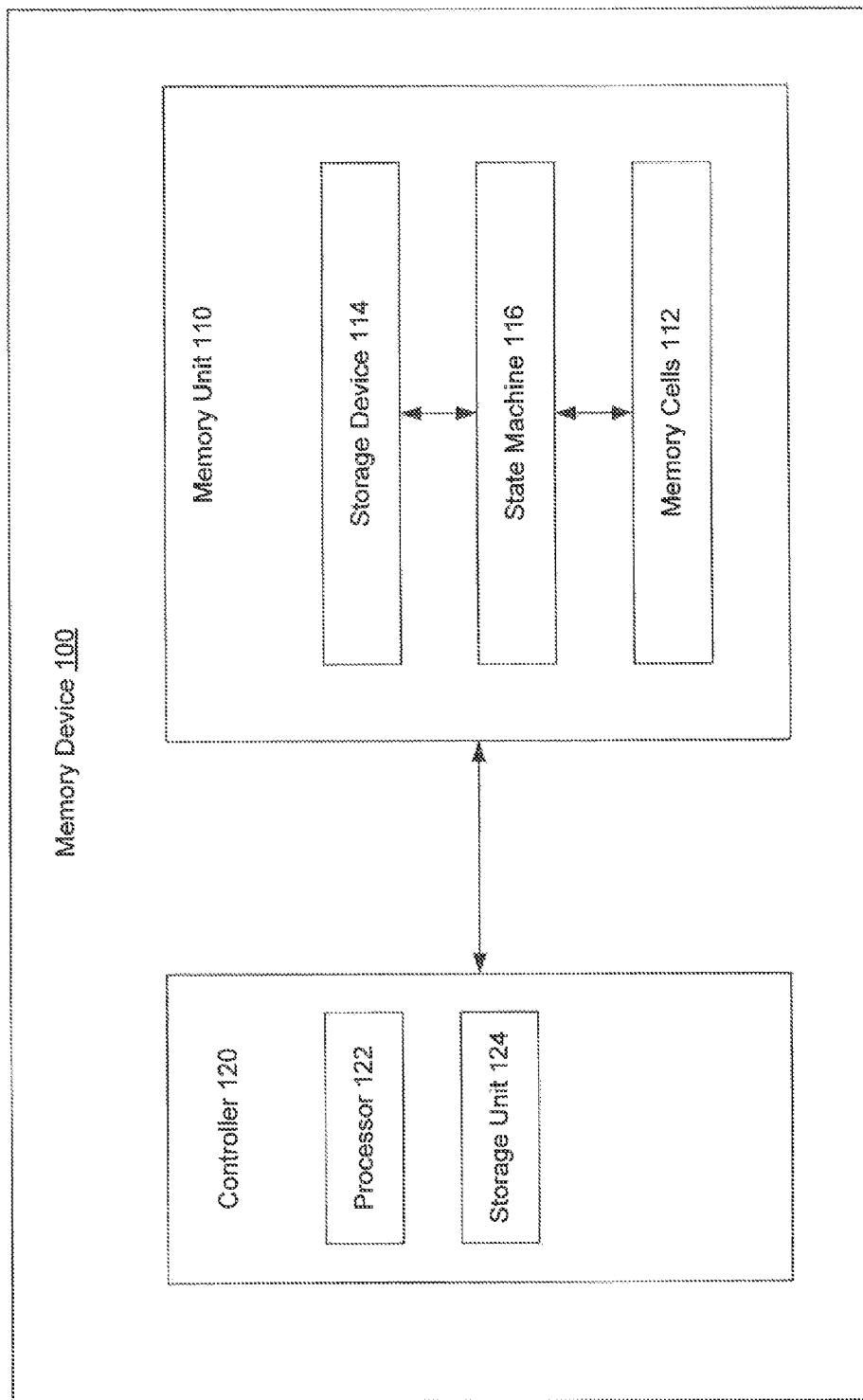
FIG. 1 is a block diagram of a memory device, according to an illustrated embodiment.

FIG. 1 is a block diagram of a memory device 100, according to an illustrated embodiment. Memory device 100 includes a memory unit 110 and a controller 120 communicatively coupled to memory unit 110.

Memory unit 110 includes an array of memory cells 112, a storage device 114, and a state machine 116. Memory cells 112 can be NOR flash memory cells, NAND flash memory cells, phase-change memory (PCM) cells, static random access memory (SRAM) cells, dynamic random access memory (DRAM) cells, resistive random access memory (RRAM) cells, or other suitable charge storage memory cells. Memory cells 112 can be programmed to store data supplied from an external device such as, for example, a host device. Storage device 114 includes logic circuits or analog circuits that are configured to store various operation parameters used by state machine 116. Storage device 114 can be selected from a volatile memory, a non-volatile memory, or a combination of both. The volatile memory can be further selected from SRAM, DRAM, cache, register or the like, and the non-volatile memory can be further selected from flash memory, phase change memory, or the like. State machine 116 includes logic circuits or analog circuits that are configured to execute various operations, such as read, program, erase, etc., on memory cells 112.

Controller 120 includes a general-purpose processor 122 and a storage unit 124 configured to store instructions executed by processor 122 to control operations of memory unit 110. In an alternative embodiment, controller 120 can include special-purpose logic circuits that are configured to control operations of memory unit 110. In another alternative embodiment, controller can be provided outside the memory device 100. Storage unit 124 can be selected from a volatile memory, a non-volatile memory, or a combination of both. The volatile memory can be further selected from SRAM, DRAM, cache, register, or the like, and the non-volatile memory can be further selected from flash memory, phase change memory, or the like.

A conventional controller typically outputs a simple control command, such as a read command, a program command, or an erase command, to memory unit 110. State machine 116 of memory unit 110 is configured with pre-defined operation algorithms, such as a pre-defined read algorithm, a pre-defined program algorithm, and a pre-defined erase algorithm. Upon receiving the control command inputted from the conventional controller, state machine 116 of memory unit 110 retrieves operation parameters from storage device 114 and executes a pre-defined operation algorithm on memory cells 112 according to the control command.

Figure 2:
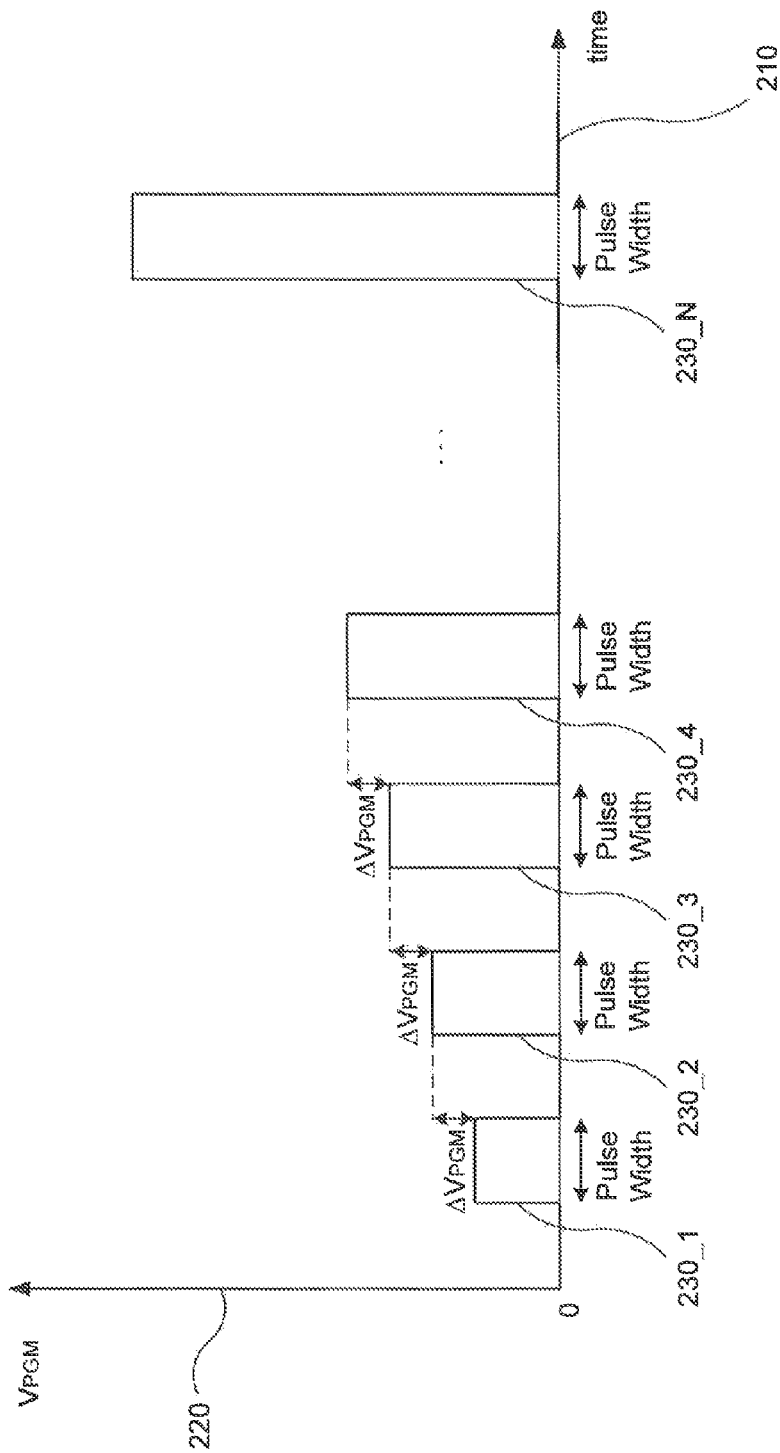
FIG. 2 is a graph illustrating program voltage versus time in an Incremental Step Pulse Programming (ISPP) algorithm, according to an example.

For example, state machine 116 of memory unit 110 can be configured to include an Incremental Step Pulse Programming (ISPP) algorithm. FIG. 2 is a graph illustrating plots of program voltage $V_{PGM}$ versus time in an ISPP algorithm, according to an example. In the graph of FIG. 2, abscissa 210 represents time and ordinate 220 represents a magnitude of program voltage $V_{PGM}$. In the ISPP algorithm, in order to program a selected memory cell to achieve a target threshold voltage, a sequence of N program pulses (i.e., program shots) 230_1, 230_2, . . . , and 230_N are applied to the selected memory cell. Each one of program pulses 230_1, 230_2, . . . , and 230_N causes an incremental change in the threshold voltage of the selected memory cell, and has a magnitude stepped up relative to the previous program pulse. The pulse widths of program pulses 230_1, 230_2, . . . , and 230_N are equal. The incremental step (i.e., the difference between two adjacent program pulses) is ΔVpgm. Program parameters such as the magnitude of the first program pulse 230_1, the incremental step ΔVpgm between two adjacent program pulses, the pulse width, and the shot number N can be pre-defined and stored in storage device 114 of memory unit 110. When memory unit 110 receives a program command from a conventional controller, state machine 116 retrieves the program parameters from storage device 114, and executes the ISPP program algorithm according to the program parameters.

One problem with the convention controller is that the conventional controller cannot monitor properties of memory cells 112, and cannot control the operation algorithm or update operation parameters of memory unit 110 when a property of memory cells 112 becomes degraded. As a result, the reliability of memory unit 110 may deteriorate.

Figure 3:
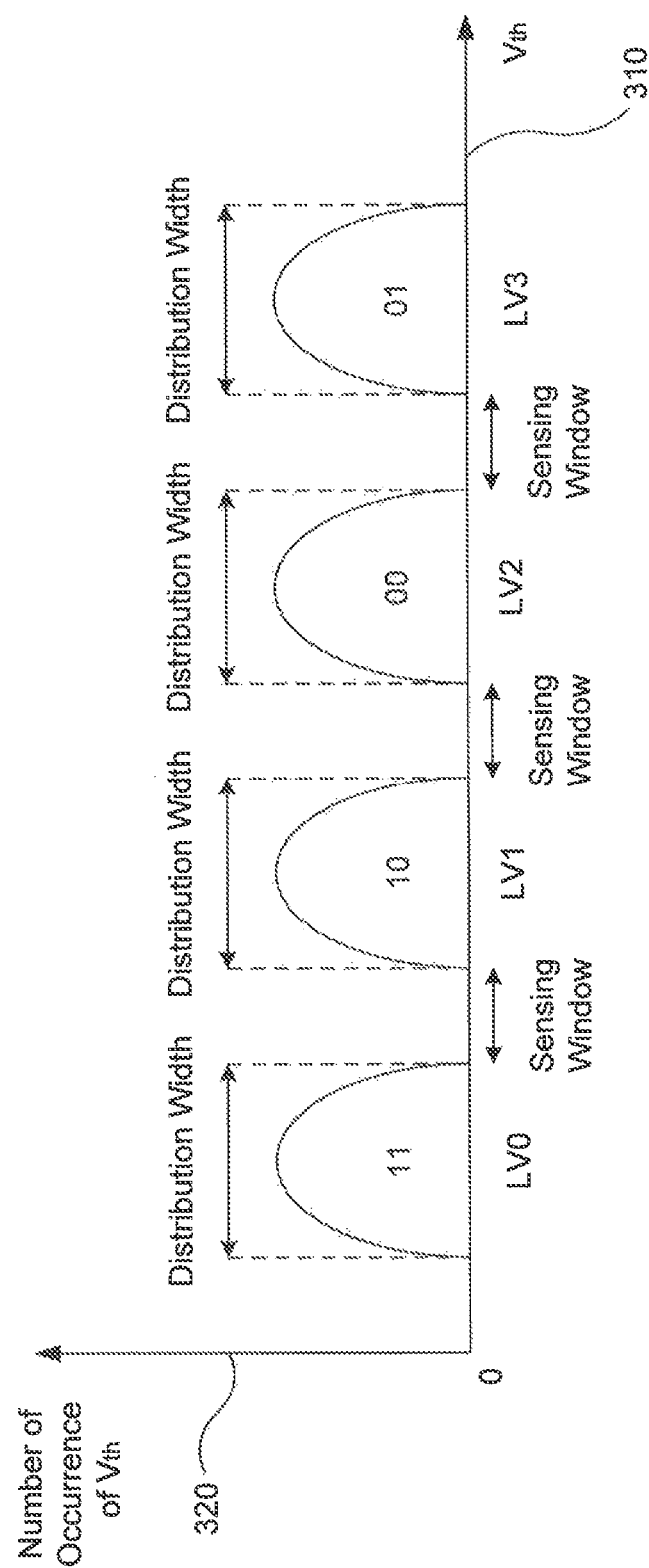
FIG. 3 schematically illustrates a threshold voltage distribution of a plurality of multi-level memory cells, according to an example.

FIG. 3 schematically illustrates a threshold voltage distribution of a plurality of multi-level memory cells, according to an example. There are four threshold voltage distributions illustrated in FIG. 3 and each distribution represents a predetermined storage status (e.g., "11", "10", "00", and "01"). In the graph of FIG. 3, abscissa 310 represents the magnitude of the threshold voltage $V_{th}$, and ordinate 320 represents the number of occurrence of a threshold voltage $V_{th}$ in the plurality of memory cells. The threshold voltage distribution illustrated in FIG. 3 has four levels respectively designated herein as LV0, LV1, LV2, and LV3. When a memory cell is programmed using the ISPP program algorithm, the threshold voltage Vth of the memory cell changes from one level to the next higher level. In some cases, after several program and erase cycles, the threshold voltage of the memory cell may drift due to various reasons, such as program disturb, read disturb, temperature variation, and data retention. If the memory cell is still programmed using the same ISPP program algorithm and the same program parameters (e.g., the same incremental step ΔVpgm,) a distribution width of the threshold voltage of the plurality of multi-level memory cells may become larger. As a result, a sensing window of the memory cells becomes smaller.

Please refer to FIG. 1 again, in order to overcome the problem associated with the conventional controller, in embodiments of the disclosure, controller 120 is configured with (i.e., "dialed in") a plurality of operation selections to be output to memory unit 110 based on properties of memory cells 112. The plurality of operation selections can be pre-stored in storage unit 124. In addition, controller 120 is configured to monitor or retrieve at least one property of memory cells 112 and select one of the operation selections based on the property of memory cells 112. In some embodiments of the disclosure, the operation selections are implemented as various binary codes. However, the operation selections can be implemented in other forms, such as strings, numbers, etc.

The plurality of operation selections are used for controlling various operations (e.g., program, read, erase) of memory unit 110. The plurality of operation selections can include a plurality of sets of operation selections respectively corresponding to a plurality of types of operation (e.g., program, read, erase) which are used to execute an operation for the selected memory unit 110. The operation selections in each set of operation selections respectively correspond to a plurality of operation algorithms for a type operation and correspond to the set.

For example, storage unit 124 can be configured to store a set of operation selections (program selections for instance) respectively corresponding to a plurality of program algorithms for the program operation of the selected memory unit 110. Table 1 summarizes several program selections, that are implemented as binary codes, for the program operation for controlling memory unit 110 to perform different program algorithms.

TABLE 1

| Selections | Program Algorithm |
|---|---|
| 000 | Normal ISPP Program |
| 001 | Larger $\Delta V_{PGM}$ ISPP Program |
| 010 | Smaller $\Delta V_{PGM}$ ISPP Program |
| 011 | Higher First Program Shot Program |
| 100 | Larger Program Pulse Width Program |
| 101 | Smaller Program Pulse Width Program |
| 110 | Two Steps Program |
| 111 | Keep ISPP in Final Shots Program |

For example, referring to FIG. 3, when a memory cell 112 in memory unit 110 has a storage status of "10", memory cell 112 has a threshold voltage that falls within a threshold voltage distribution window of LV1. Due to program disturb, read disturb, temperature variation, or data retention, the threshold voltage of memory cell 112 might drift out of window of LV1. Under a program operation, when controller 120 detects the drifting of the threshold voltage of memory cell 112, controller 120 issues one of the program selections in Table 1 to perform a program algorithm in memory unit 110.

In addition, storage unit 124 can also be configured to store various read selections corresponding to various read algorithms (e.g., forward current read, forward voltage read, reverse voltage read, etc.,) and various erase selections corresponding to various erase algorithms (e.g., word line zero bias erase, word line negative bias erase, etc.)

The operation selections can also include a plurality of update selections corresponding to a retrieved property from the memory cell for updating operation parameters that are stored in storage device 114 of memory unit 110. In an alternative embodiment, storage device 114 can be a part of memory cells 112 for storing such operation parameters. The operation parameters can include the magnitude of first program pulse 230_1, the incremental step ΔVpgm between two adjacent program pulses, the pulse width, and the shot number N as illustrated in FIG. 3, etc.

For example, controller 120 can be configured with various update selections for updating various operation parameters in each program algorithm, each read algorithm, and each erase algorithm. The various update selections can be stored in storage unit 124 of controller 120.

Figure 4:
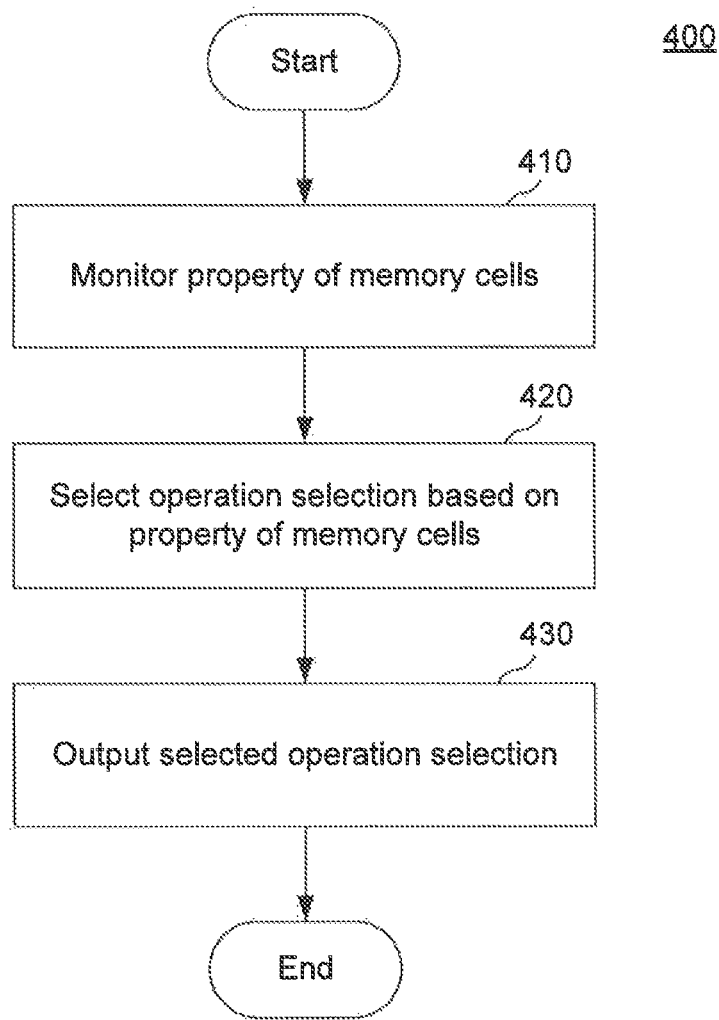
FIG. 4 is a flow chart illustrating a process of controlling a memory unit by a controller, according to an illustrated embodiment.

FIG. 4 is a flow chart illustrating a process 400 of controlling memory unit 110 by controller 120, according to an illustrated embodiment. As illustrated in FIG. 4, controller 120 first monitors at least one property of at least one memory cell 112 in memory unit 110 (step 410). Controller 120 can monitor the property of the at least one memory cell 112 by retrieving and analyzing property information such as page fail bit count, program and erase cycle number, program shot number, erase shot number, threshold voltage shift value during a dump program operation, etc. The page fail bit count represents the number of fail bits in a page of data. The page fail bit count can be calculated from Error Correction Code (ECC) information provided by memory unit 110. The program and erase cycle number represents the number of program and erase cycles performed by memory unit 110. The program shot number represents the number of program shots (i.e., program pulses) applied to selected memory cells during a program operation. The erase shot number represents the number of erase shots applied to selected memory cells during an erase operation. The threshold voltage shift value represents the change in the threshold voltage of a memory cell during the dump program operation.

In one embodiment, controller 120 monitors the property of the at least one memory cell 112 by passively receiving property information from memory unit 110. For example, memory unit 110 automatically transmits the property information along with data read from memory cells 112 during a read operation. In another embodiment, controller 120 is configured with (i.e., "dialed in") various monitor commands for requesting various property information from memory unit 110. For example, controller 120 issues a monitor command to memory unit 110 for requesting property information. Upon receiving the monitor command, state machine 116 of memory unit 110 transmits the requested property information to controller 120. In still another embodiment, controller 120 automatically monitors and records property information, such as program and erase cycle number, in storage unit 124.

Controller 120 then selects an operation selection from a plurality of operation selections stored in storage unit 124 based on the property of memory cells 112 (step 420). In particular, controller 120 first determines a suitable operation algorithm based on the property of memory cells 112 in memory unit 110, and then selects an operation selection that corresponds to the determined operation algorithm.

For example, as illustrated in FIG. 3, when the program or erase cycle number of memory cells 112 increases, if the same ISPP program algorithm is used for programming memory cells 112, then a threshold voltage distribution width of memory cells 112 has become larger, and a sensing window of memory cells 112 has become smaller. Thus, according to the illustrated embodiment, when controller 120 determines that the program or erase cycle number of memory cells 112 exceeds a predetermined threshold number, controller 120 determines to control memory unit 110 to perform a smaller $\Delta V_{PGM}$ ISPP program algorithm. Controller 120 then selects an operation selection that corresponds to the smaller $\Delta V_{PGM}$ ISPP program algorithm. According to Table 1 above, the smaller $\Delta V_{PGM}$ ISPP program algorithm corresponds to the operation selection "010". Thus, controller 120 selects "010" as the operation selection.

Controller 120 then outputs (i.e., issues) the selected operation selection to memory unit 110 (step 430). In some embodiments, the operation selection also includes data. In the example described above, the operation selection includes the binary code "010" for the smaller $\Delta V_{PGM}$ ISPP program algorithm, data to be programmed in memory unit 110, and the address of the data to be programmed in memory unit 110.

In response to the operation selection received from controller 120, memory unit 110 executes the operation algorithm corresponding to the operation selection. In particular, state machine 116 of memory unit 110 retrieves operation parameters from storage device 114, and executes the operation algorithm according to the retrieved operation parameters in which the operation parameters correspond to the issued operation selection.

In the example described above, when memory unit 110 receives the smaller $\Delta V_{PGM}$ ISPP program selection, state machine 116 of memory unit 110 retrieves program parameters from storage device 114, and executes the smaller $\Delta V_{PGM}$ ISPP program algorithm according to the retrieved program parameters. Then, process 400 finishes.

Figure 5:
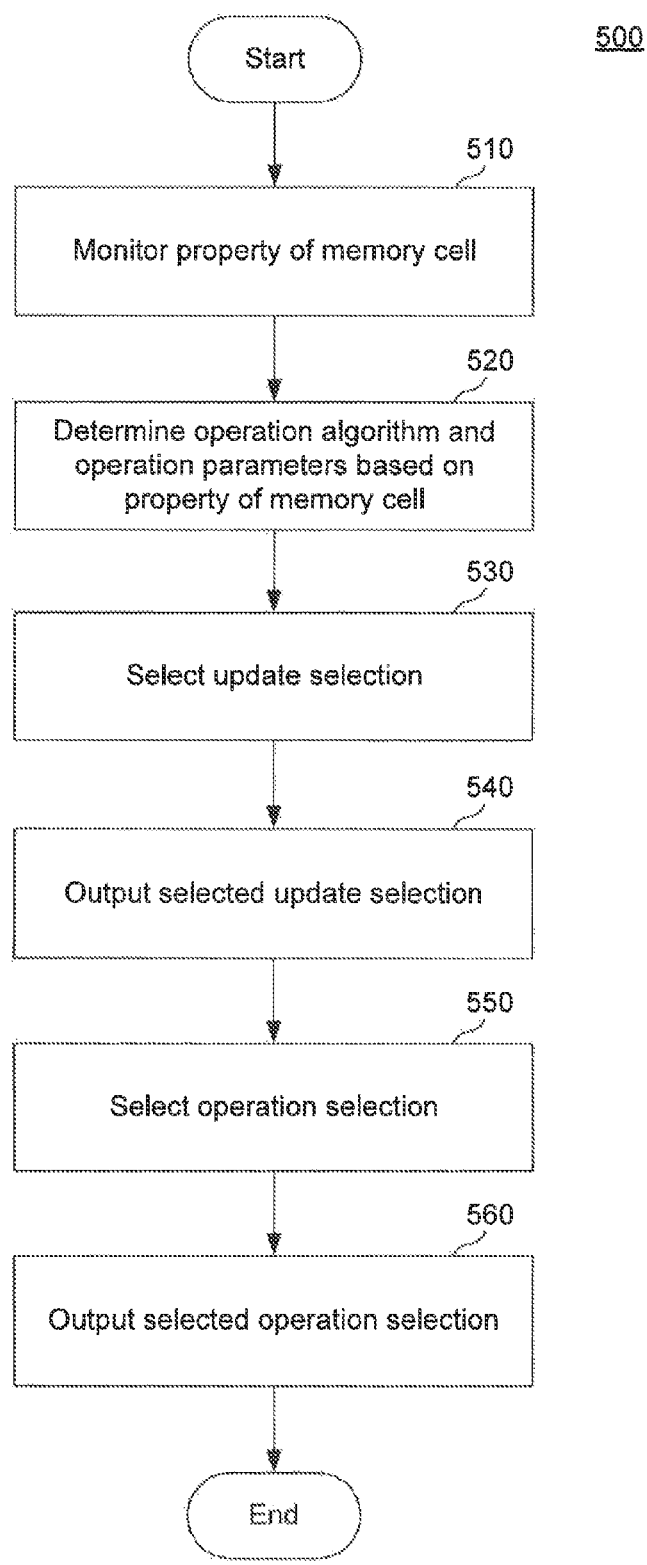
FIG. 5 is a flow chart illustrating a process of controlling a memory unit by a controller, according to an illustrated embodiment.

FIG. 5 is a flow chart illustrating a process 500 of controlling memory unit 110 by controller 120, according an illustrated embodiment. As illustrated in FIG. 5, controller 120 first monitors at least one property of at least one memory cell 112 in memory unit 110 (step 510). Step 510 is similar to step 410, and thus a detailed description of step 510 is not provided.

Controller 120 determines an operation algorithm and operation parameters based on the property of the at least one memory cell 112 (step 520). For example, when the property of the at least one memory cell 112 changes, controller 120 determines to change the operation parameters according to the changed property of the at least one memory cell 112. With reference to FIG. 3, in an alternative example, when controller 120 determines that the program and erase cycle number of the at least one memory cell 112 exceeds the predetermined threshold number, controller 120 determines that a normal program with a decreased incremental step $\Delta V_{PGM}$ should be performed in memory unit 110, and determines an updated value (i.e., a changed value) for the incremental step $\Delta V_{PGM}$. The updated value for the incremental step $\Delta V_{PGM}$ is smaller than a last-used value of the incremental step $\Delta V_{PGM}$.

Controller 120 selects an update selection from a plurality of update selections stored in storage unit 124, for updating an operation parameter in storage device 114 (step 530). In the alternative example described above, when controller 120 determines that the incremental step $\Delta V_{PGM}$ should be decreased, controller 120 selects an update selection from the plurality of binary codes (refer to Table 1) stored in storage unit 124 for updating the incremental step. The selected update selection is unique information for updating the incremental step $\Delta V_{PGM}$.

Controller 120 then outputs the selected update selection to memory unit 110 (step 540). The selected update selection also includes an updated value of the operation parameter. In the alternative example described above, the selected update selection includes the updated value for the incremental step $\Delta V_{PGM}$.

In some embodiments, when a plurality of operation parameters need to be updated, controller 120 outputs a plurality of selected update selections among the update selections stored in the storage units for updating the plurality of operation parameters in storage device 114. In some alternative embodiments, controller 120 outputs a single selected update selection which instructs memory unit 110 to update a plurality of operation parameters for a specific operation algorithm. In such embodiments, the single selected update selection includes update values of the plurality of operation parameters.

In response to the selected update selection received from controller 120, memory unit 110 updates the operation parameter according to the selected update selection. In particular, state machine 116 of memory unit 110 updates the operation parameter in storage device 114 according to the updated value. In the alternative example described above, when memory unit 110 receives the selected update selection from controller 120 for updating the incremental step, state machine 116 of memory unit 110 updates the incremental step $\Delta V_{PGM}$ in storage device 114 according to the updated value included in the selected update selection received from controller 120.

Controller 120 also selects an operation selection corresponding to the determined operation algorithm (step 550). In the alternative example described above, when controller 120 determines that the normal ISPP program algorithm should be performed, controller 120 selects a normal ISPP program selection that corresponds to the normal ISPP program algorithm. According to Table 1 above, the normal ISPP program algorithm corresponds to the binary code "000". Thus, controller 120 selects "000" as the operation selection for the normal ISPP program algorithm.

Controller 120 then outputs the selected operation selection to memory unit 110 (step 560). The operation selection includes data. In the alternative example described above, controller 120 outputs a normal ISPP program selection that includes the code "000" for the normal ISPP program algorithm, data to be programmed in memory unit 110, and the address of the data to be programmed in memory unit 110.

In response to the operation selection received from controller 120, memory unit 110 executes the operation algorithm according to the operation selection. In the alternative example described above, when memory unit 110 receives the normal ISPP program selection, state machine 116 of memory unit 110 retrieves program parameters from storage device 114, and executes the normal ISPP program algorithm according to the retrieved program parameters. Then, process 500 finishes.

Figure 6:
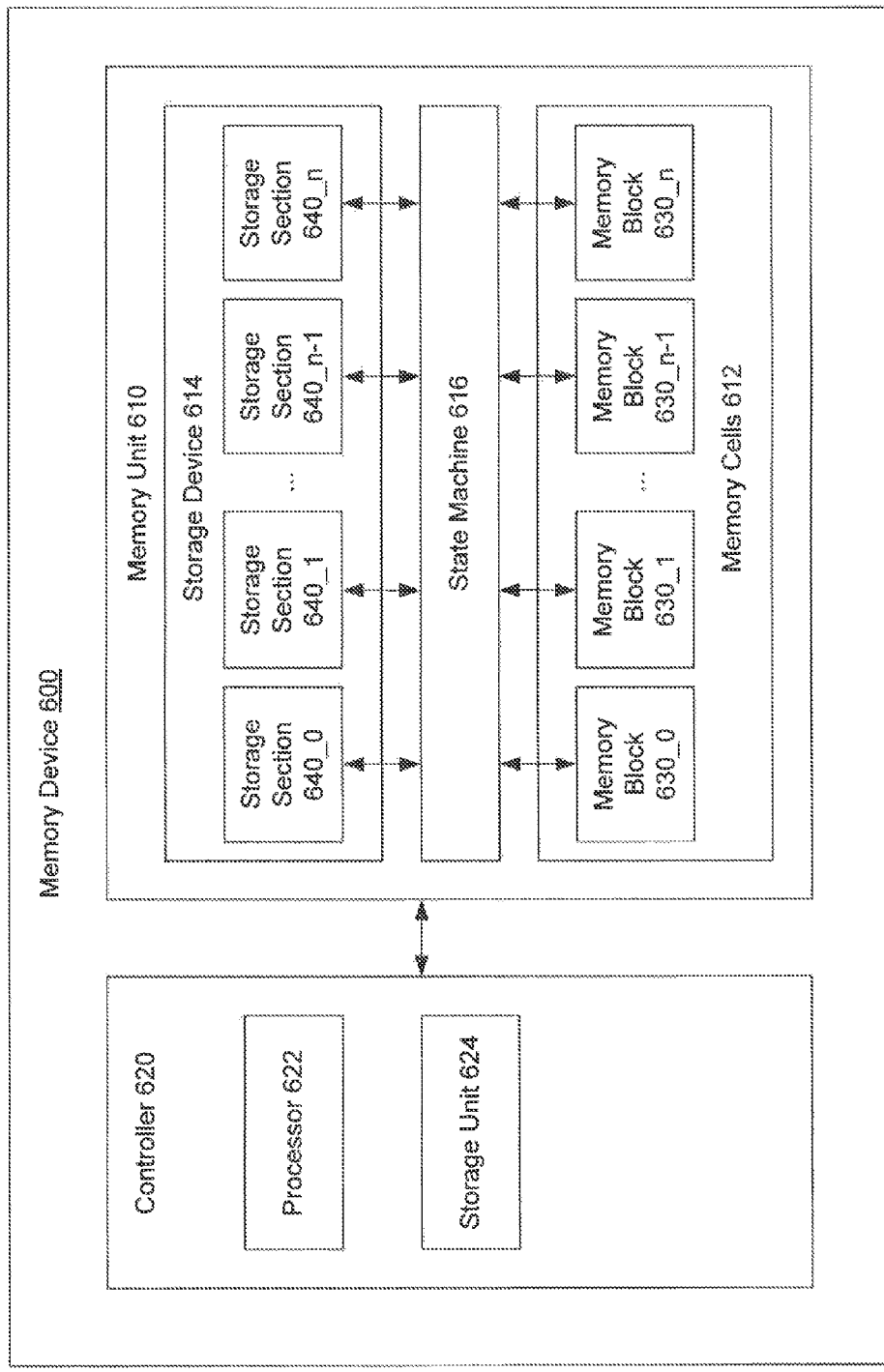
FIG. 6 is a block diagram of a memory device according to an illustrated embodiment.

FIG. 6 is a block diagram of a memory device 600, according to an illustrated embodiment. Memory device 600 includes a memory unit 610 and a controller 620. Memory unit 610 includes an array of memory cells 612, a storage device 614, and a state machine 616. Memory cells 612 can be NOR flash memory cells, NAND flash memory cells, PCM cells, SRAM cells, DRAM cells, RRAM cells, or other suitable charge storage memory cells. Memory cells 612 are divided into a plurality of memory blocks 630_0, 630_1, ..., and 630_n. Storage device 614 includes logic circuits or analog circuits that are configured to store a plurality of operation parameters. Storage device 614 can be selected from SRAM, DRAM, cache, or register. Storage device 614 includes storage sections 640_0, 640_1, ..., and 640_n, respectively corresponding to memory blocks 630_0, 630_1, ..., and 630_n. Each one of storage sections 640_0, 640_1, ..., and 640_n is configured to store operation parameters for a corresponding one of memory blocks 630_0, 630_1, ..., and 630_n. State machine 616 includes logic circuits or analog circuits that are configured to execute various operations, such as read, program, erase, etc., on memory cells 612. Controller 620 includes a general-purpose processor 622 and a storage unit 624 configured to store instructions executed by processor 622 to control operations of memory unit 610. In an alternative embodiment, controller 620 can include special-purpose logic circuits that are configured to control operations of memory unit 610.

The properties of memory cells 612 in memory blocks 630_0, 630_1, ..., and 630_n may be different from each other due to, for example, differences in physical characteristics of memory cells 612 or differences in data stored in memory cells 612. Thus, in the illustrated embodiment, controller 620 is configured to monitor the properties of memory cells 612 in each of memory blocks 630_0, 630_1, ..., and 630_n, and determine an operation algorithm and/or operation parameters for each of memory blocks 630_0, 630_1, ..., and 630_n based on the monitored performance.

Figure 7:
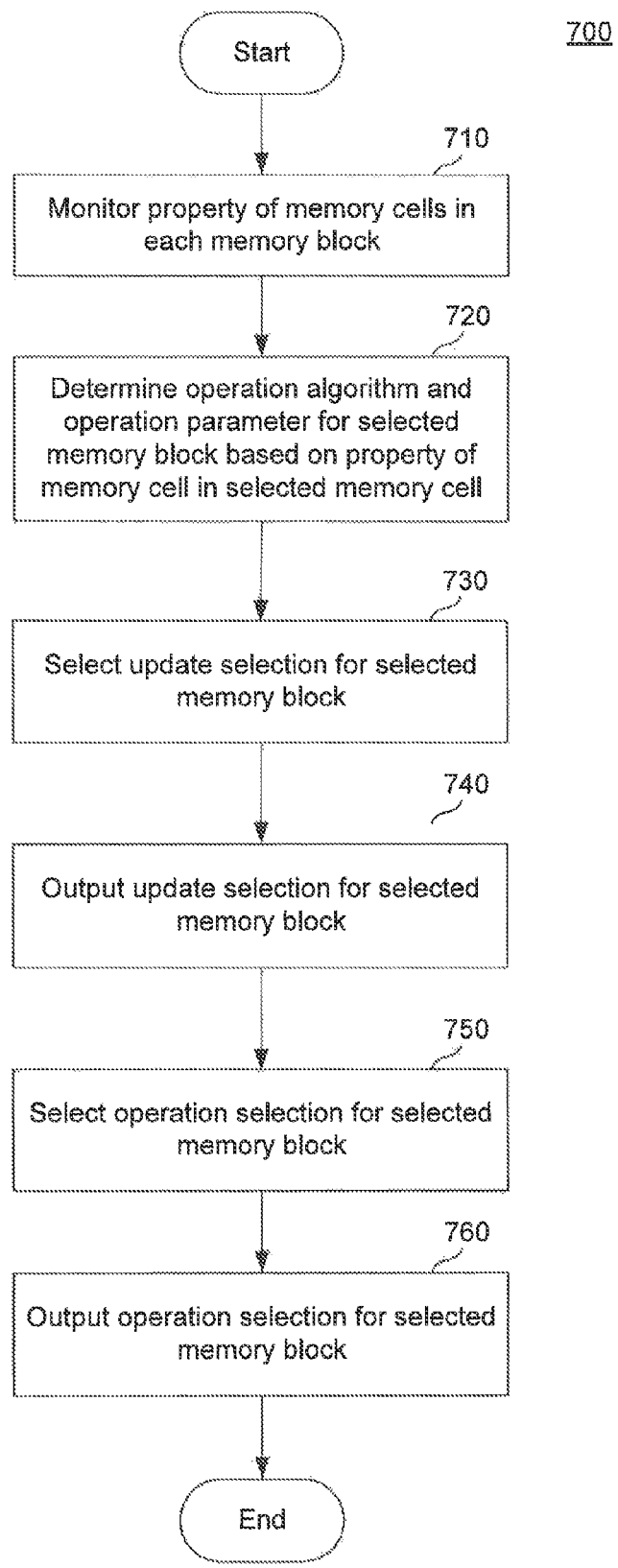
FIG. 7 is a flow chart illustrating a process of controlling a memory unit by a controller, according to an illustrated embodiment.

FIG. 7 is a flow chart illustrating a process 700 of controlling memory unit 610 by controller 620, according to such an embodiment. As illustrated in FIG. 7, controller 620 monitors at least one property of at least one memory cell 612 in each of memory blocks 630_0, 630_1, ..., and 630_n (step 710). Controller 620 can monitor the property based on property information such as page fail bit count, program and erase cycle number, program short number, erase shot number, or $\Delta$Vt shift value during a dump program operation, etc., of memory cells 612 in each of memory blocks 630_0, 630_1, ..., and 630_n.

Controller 620 determines an operation algorithm and operation parameters for a selected one of memory blocks 630_0, 630_1, ..., and 630_n based on the property of memory cell 612 in the selected memory block (step 720). Controller 620 then selects an update selection for updating an operation parameter for the selected memory block (step 730). The update selection is unique information for updating the operation parameter.

Controller 620 outputs the selected update selection for the selected memory block (step 740). The update operation selection includes an updated value of the operation parameter and an address of one of storage sections 640_0, 640_1, ..., and 640_n that corresponds to the selected memory block. For example, an update selection for updating an operation parameter for memory block 630_0 includes an address of storage section 640_0 that corresponds to memory block 630_0

In response to the update selection received from controller 620, memory unit 610 updates the operation parameter in a storage section in storage device 614 corresponding to the selected memory block. In particular, state machine 616 of memory unit 610 updates the operation parameter in the storage section in storage device 614 corresponding to the address included in the update selection. In the example described above, when memory unit 610 receives the update selection for updating the operation parameter for memory block 630_0, state machine 616 updates the operation parameter in storage section 640_0 according to the updated value included in the update selection.

Controller 620 also selects an operation selection corresponding to the operation algorithm determined for the selected memory block (step 750). Controller 620 then outputs the selected operation selection to memory unit 610 (step 760). The operation selection includes and an address of the selected memory block.

In response to the operation selection, memory unit 610 executes the operation algorithm on the selected memory block according to the operation selection. In particular, state machine 616 of memory unit 610 retrieves operation parameters from the one of storage sections 640_0, 640_1, ..., and 640_n that corresponds to the selected memory block, and executes the operation algorithm on the selected memory block according to the retrieved operation parameters. Then, process 700 finishes.

According to the above described embodiments, the controller is capable of monitoring the performance of the memory cells in the memory unit, determining an operation algorithm and operation parameters used by the memory unit based on the performance of the memory cells, and controlling the memory unit to execute the determined operation algorithm with the determined operation parameters. In such manner, when the performance of the memory cells degrades, the controller is capable of adjusting the operation algorithm and/or operation parameters used by the memory unit to improve the performance of the memory cells. Thus, the reliability of the memory unit can be improved.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device, comprising:
   a memory unit including a plurality of memory cells; and
   a controller including a storage unit that stores a plurality of operation selections, each operation selection corresponding to a property of at least one selected memory cell among the plurality of memory cells.

2. The memory device of claim 1, wherein the operation selections respectively correspond to at least one of program operation, read operation, or erase operation.

3. The memory device of claim 2, wherein the controller is configured to:
   determine an operation algorithm to be performed on the memory unit based on the property of the selected memory cell; and
   select one of the operation selections to execute the determined operation algorithm.

4. The memory device of claim 1, wherein the memory unit includes a storage device configured to store a plurality of operation parameters to be used by the memory unit, and
   wherein each of the operation selections corresponds to at least one of the operation parameters.

5. The memory device of claim 4, wherein the controller is configured to:
   issue one of the operation selections to the memory unit after retrieving and analyzing the property of the selected memory cell, and then the at least one of the operation parameters corresponding to the issued operation selection is used by the memory unit to execute an program operation, read operation, or erase operation.

6. The memory device of claim 4, wherein the property of the selected memory cell is page fail bit count, program and erase cycle number, program short number, erase shot number, or threshold voltage shift value during a dump program operation, wherein the operation parameters are changed according to a changed property of the selected memory cell.

7. The memory device of claim 1, wherein the controller is configured to monitor the property of the selected memory cell by outputting a monitor command to the memory unit for requesting property information of the memory cell.

8. The memory device of claim 4, wherein the plurality of memory cells in the memory unit are divided into a plurality of memory blocks,
   the storage device of the memory unit further including a plurality of storage sections respectively corresponding to the plurality of memory blocks,
   each one of the plurality of storage sections being configured to store operation parameters for the corresponding one of the plurality of memory blocks.

9. A memory unit, comprising:
   a plurality of memory cells; and
   a storage device configured to store a plurality of operation parameters to be used for a program operation, read operation, or erase operation of the memory cells,
   wherein the operation parameters are changed according to a property of at least one selected memory cell among the plurality of memory cells.

10. The memory unit of claim 9, wherein the plurality of memory cells in the memory unit are divided into a plurality of memory blocks,
    the storage device of the memory unit further including a plurality of storage sections respectively corresponding to the plurality of memory blocks, and
    each one of the plurality of storage sections being configured to store operation parameters for the corresponding one of the plurality of memory blocks.

11. The memory device of claim 9, wherein the property of the memory cell is page fail bit count, program and erase cycle number, program short number, erase shot number, or threshold voltage shift value during a dump program operation, wherein the operation parameters are changed according to the changed property of the selected memory cell.

12. A control method for a memory device, wherein the memory device comprises a controller and a memory unit, the method comprises:
    storing a plurality of operation selections in a storage unit;
    monitoring a property of at least one selected memory cell among a plurality of memory cells in the memory unit; and
    selecting one of the plurality of operation selections based on the property of the selected memory cell.

13. The method of claim 12, wherein the operation selections respectively correspond to at least one of program operation, read operation, or erase operation.

14. The method of claim 13, wherein the selecting one of the plurality of operation selections based on the property of the selected memory cell includes:
    determining an operation algorithm to be performed on the memory unit based on the property of the selected memory cell; and
    selecting one of the operation selections to execute the determined operation algorithm.

15. The method of claim 12, wherein the memory unit includes a storage device configured to store a plurality of operation parameters to be used by the memory unit, and
    wherein each of the operation selections corresponds to at least one of the operation parameters.

16. The method of claim 15, further including:
    issuing one of the operation selections to the memory unit after retrieving and analyzing the property from the plurality of memory cells, and then the at least one of the operation parameters corresponding to the issued operation selection is used by the memory unit to execute a program operation, read operation, or erase operation.

17. The method of claim 15, wherein the monitoring of a property of a selected memory cell in the memory unit includes:
    monitoring at least one of page fail bit count, program and erase cycle number, program short number, erase shot number, or threshold voltage shift value during a dump program operation of the selected memory cell, and
    the method further including:
    changing the operation parameters according to a changed property of the selected memory cell.

18. The method of claim 12, wherein the monitoring of a property of a selected memory cell in the memory unit includes:
    outputting a monitor command to the memory unit for requesting property information of the selected memory cell.

19. The method of claim 14, wherein the plurality of memory cells in the memory unit are divided into a plurality of memory blocks, the storage device of the memory unit further including a plurality of storage sections respectively corresponding to the plurality of memory blocks, each one of the plurality of storage sections being configured to store operation parameters for the corresponding one of the plurality of memory blocks.

20. The method of claim 19, further including:

monitoring the at least one property of the memory cells in a selected one of the plurality of memory blocks;

determining an operation selection for the selected memory block based on the at least one property of the memory cells in the selected memory block; and storing an update operation parameter according to the changed property of the memory cells in the selected memory block.

* * * * *